June 27, 1967 H. O. WOLCOTT 3,328,711

INFINITE PLATE LOAD IMPEDANCE AMPLIFIER

Filed Oct. 9, 1963 2 Sheets-Sheet 1

INVENTOR.
HENRY O. WOLCOTT
BY Harry R. Lubcke
AGENT

June 27, 1967 H. O. WOLCOTT 3,328,711

INFINITE PLATE LOAD IMPEDANCE AMPLIFIER

Filed Oct. 9, 1963 2 Sheets-Sheet 2

INVENTOR.
HENRY O. WOLCOTT

BY Harry R. Lubcke
AGENT

United States Patent Office 3,328,711
Patented June 27, 1967

3,328,711

INFINITE PLATE LOAD IMPEDANCE AMPLIFIER

Henry O. Wolcott, Chatsworth, Calif., assignor to Optimation, Inc., Sun Valley, Calif., a corporation of California Filed Oct. 9, 1963, Ser. No. 315,076
17 Claims. (Cl. 330—3)

Figure 1:
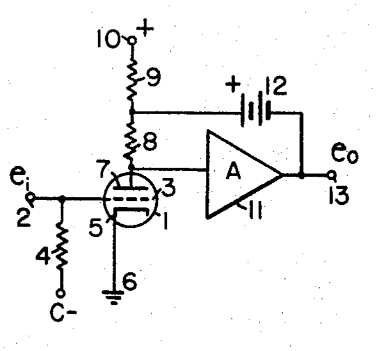

My invention relates to an amplifier having inherently low distortion and high gain stability.

The family of plate current vs. plate voltage curves for equal increments of grid bias potential are well known in the vacuum tube art. By means of the known load line the linearity performance of the tube as an amplifier can be predicted. Since the plate load is invariably an impedance of finite magnitude, the load line invariably is considerably inclined to the horizontal and it extends downward into the region where the curves run together at low plate currents.

However, should the load line be horizontal, the increments of plate voltage change for equal increments of grid voltage are relatively in a linear relation. This is particularly true for frame grid vacuum tubes.

The horizontal load line represents operation with a plate load impedance of infinite value. Such a value cannot be actually achieved in practice, but a reasonable approach to the same, of the order of several megohms, for the equivalent plate load impedance can be achieved. This is while still retaining the operation of the vacuum tube in the usual and desired milliampere range of plate current. The degree of distortionless amplification obtained is essentially the same as for the fully infinite load line.

I am able to approximate an infinite load impedance for a vacuum tube by adding active circuit elements to a plate load impedance of usual value.

I obtain an additional dividend by accomplishing an effectively infinite load impedance in that the gain of the amplifier becomes independent of all usual operational factors and is determined exclusively by the amplification factor of the vacuum tube. This provides excellent gain stability.

Accordingly, I obtain the characteristic of negative feedback without employing such feedback. This is important in certain applications of an amplifier where negative feedback cannot be applied. These include a resistance-capacitance tuned audio oscillator or a frequency-selective amplifier, or particularly where local positive feedback is used to increase gain. In other applications of my amplifier, where negative feedback can be applied, distortion is reduced and stability is increased by a whole order of magnitude over that possible to the prior art.

Extreme amplifier fidelity and stability is demanded in the present day electronics art. As an example, in calibrating the recently-developed digital-indicating voltmeter having a four place indication, an amplifier having an output amplitude stability of 0.01% is required in combination with a similarly stable signal source. Unless this is achieved the last decimal place on the voltmeter will flutter between two values. If the operator is attempting to calibrate at 20.00 volts, say, this might mean recycling of the whole register between the 19.99 and 20,000 values. Under these circumstances calibration is inconvenient.

In the matter of fidelity, spurious effects of amplifier-generated harmonics cannot be tolerated in instrumentation applications. In the calibration of meters the presence of harmonics causes a difference between the indications of a thermal type meter and a rectifier type meter having equal sensitivities. Because of the resonant mechanical amplification of certain frequencies in practical vibration exciters the amplifiers to calibrate the same must be essentially free of harmonics. Because the "Q" of the mechanical resonances may be high, the vibrational amplitude at a harmonic may even be equal to the vibrational amplitude of the desired fundamental. Such a condition obtains if the Q for the mechanical resonance was 100 and the distortion (i.e., harmonic) was 1% of the fundamental.

My additional active element used in conjunction with the plate load comprises a constant current source in the form of an additional vacuum tube or a transistor connected to the plate load.

An object of my invention is to provide a highly linear and highly stable electrical amplifier.

Another object is to provide an amplifier that employs both a vacuum tube and a transistor in a single stage.

Another object is to provide an amplifier having a gain dependent only upon a structural parameter of a vacuum tube.

Another object is to provide an amplifier having single-ended or differential inputs as well as single-ended or push-pull outputs.

Another object is to provide an amplifier that is relatively simple and inexpensive and which operates at nominal supply voltages.

Other objects will become apparent upon reading the following detailed specification and upon examining the accompanying drawings, in which are set forth by way of illustration and example certain embodiments of my invention.

Figure 2:
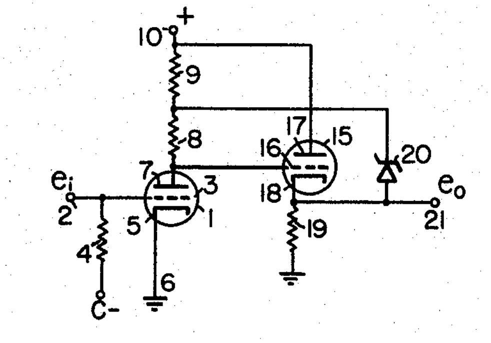
Figure 3:
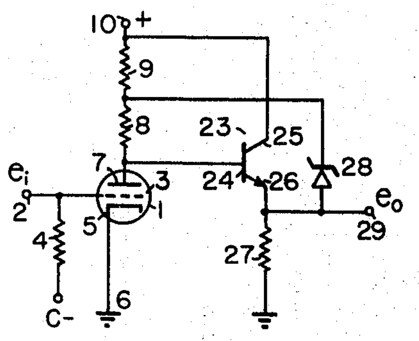
Figure 4:
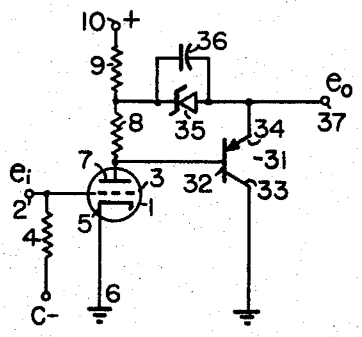
Figure 5:
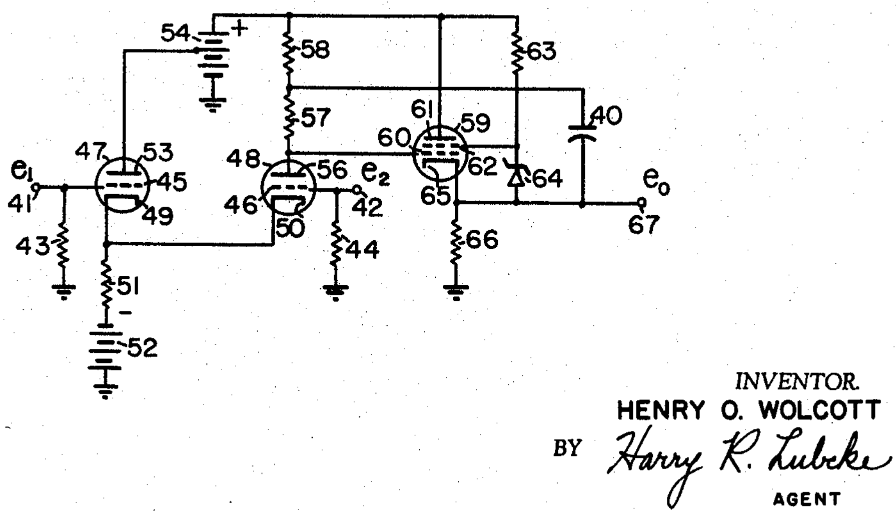
Figure 6:
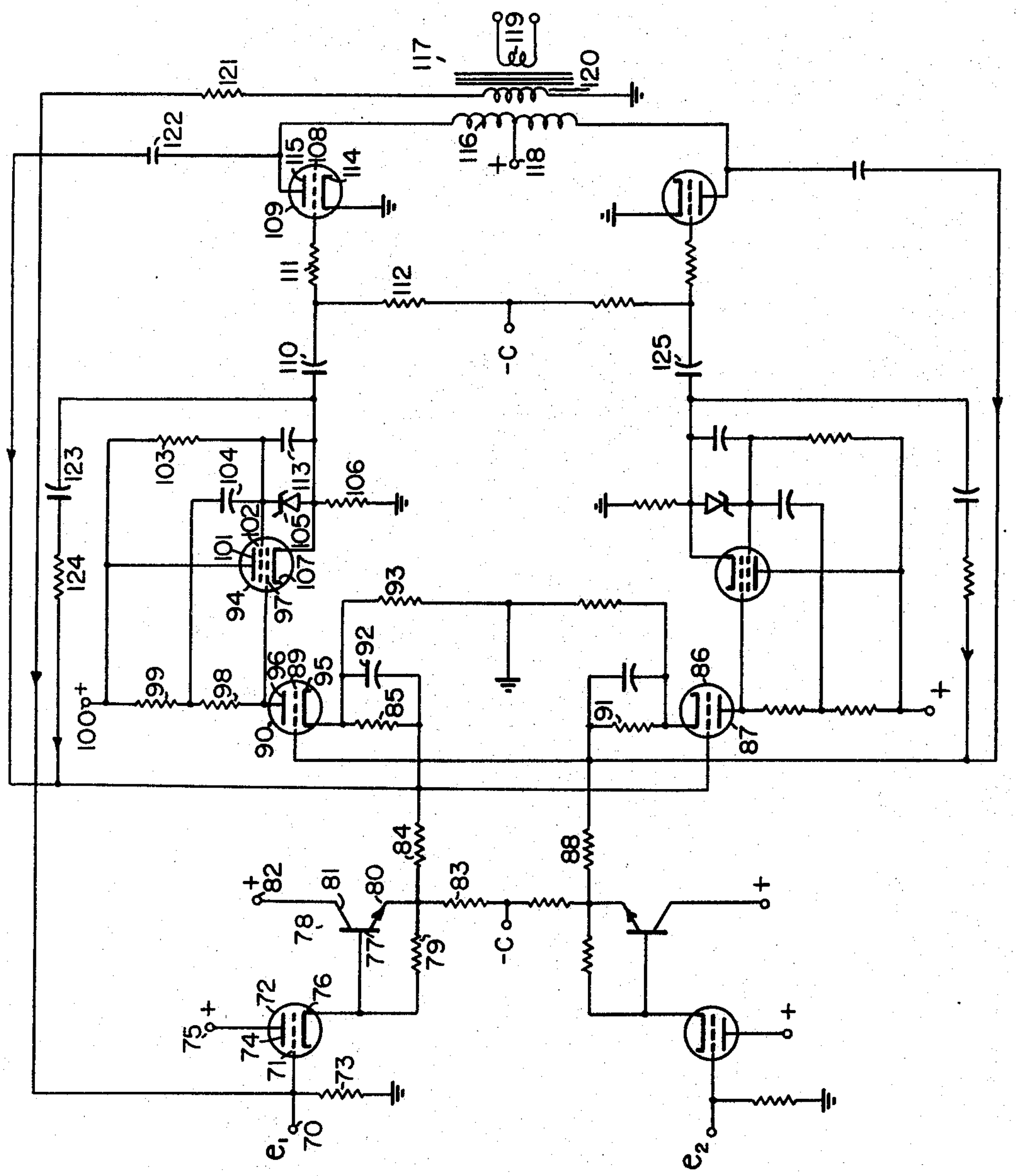

FIG. 1 is a schematic diagram of my amplifier stage with a generically indicated additional amplifying means of unity voltage gain for providing an effectively infinite plate load impedance, FIG. 2 is the same with a cathode-follower vacuum tube additional amplifying means, FIG. 3 is the same with an NPN transistor additional amplifying means, FIG. 4 is the same with a PNP transistor additional amplifying means, FIG. 5 is a schematic diagram of a differential signal input amplifier stage with a tetrode additional amplifying means, and FIG. 6 is a schematic diagram of a complete differential input, push-pull output amplifier employing tetrode additional amplifying means.

In FIG. 1 numeral 1 represents a vacuum tube, of which one of the triode sections of a 12AX7 vacuum tube is an example. A signal to be amplified, $e_1$, is impressed upon terminal 2, which connects to grid 3 of tube 1. A grid return impedance, as resistor 4, connects to a source of negative potential C— and therethrough to signal ground to provide the known negative grid bias upon grid 3. Cathode bias may also be used without the usual degeneration at low and medium audio frequency ranges since the cathode-plate current is essentially constant with my constant current type amplifier circuit. Cathode 5 is connected to ground 6. Plate 7 is conected to a plate impedance, which is here shown as resistor 8. Isolation resistor 9 connects between plate resistor 8 and a known plate voltage power supply or battery indicated by + terminal 10. Amplifier 11 is a non-phase-inverting amplifier stage having, ideally, a gain of one. Battery 12 connects from the output of amplifier 11 to the junction between resistive elements 8 and 9. Battery 12 determines, in combination with resistor 8, the plate current of tube 1. In this type of circuit the plate current is equal to the voltage of battery 12 divided by the resistance of resistor 8. Signal variations are transmitted through battery 12 substantially without attenuation. The amplified output signal, $e_0$, appears at the output of amplifier 11, at terminal 13.

Amplifier 11 acts to provide an infinite plate load impedance for vacuum tube 1 by providing a signal of the same phase and of essentially the same amplitude at the junction between resistors 8 and 9 as appears at plate 7.

This makes the voltage at both points independent of current flow; a mathematical indeterminate which has the effect of an infinite plate load impedance.

When the gain of amplifier 11 is exactly unity, the multiplication of the value of the actual plate load resistor 8 is infinite and so the plate load impedance is infinity. Cathode-follower vacuum tubes or emitter-follower transistors provide realizable practical embodiments of amplifier 11. The gain of the same can approach but not reach unity. Thus, the multiplication factor is large, but not infinitely large. For example, if the gain of amplifier 11 is 0.99, the multiplication is 100 times. A resistance of 50,000 ohms is typical for resistor 8; thus the effective plate load impedance is 50,000×100=5 megohms. A satisfactory plate current for the typical 12AX7 vacuum tube triode section is one milliampere. The 5 megohm effective plate load impedance is sufficient to give a substantially horizontal load line and thus one which avoids the crowded relation of the plate current vs. plate voltage curves for the vacuum tube at low plate current values.

As to the stability of gain of the amplifier, consider the known equation for the gain of a vacuum tube amplifying stage:

$$A=\frac{\mu R_L}{R_L+R_p} \qquad (1)$$

where:

$\mu$=amplification factor of the vacuum tube
$R_L$=load impedance
$R_p$=internal plate impedance of the vacuum tube In the present instance, where the plate load impedance is, for all practical purposes, infinite, the denominator term $R_p$ may be neglected.

Thus we have:

$$A=\mu\frac{R_L}{R_L}=\mu \qquad (2)$$

The amplification factor $\mu$ depends only upon the physical structure of the vacuum tube; principally upon the distance from grid to cathode and grid to plate and the fineness of the grid mesh (i.e., the closeness of spacing of one grid wire to the next within the electron stream between cathode and plate.

It is immediately evident that the gain of my amplifier is independent of the usual operating parameters; such as mutual conductance, which is the quotient of the amplification factor over the internal plate impedance. The latter is affected by such operating factors as plate current, plate voltage, filament (heater) voltage, emissivity of the cathode, and by residual conditions within the vacuum tube throughout its life.

The inherent stability of the gain of my amplifier is believed to represent a highly significant advance over the prior art.

In the practical embodiment of FIG. 2, elements 1 through 10 have the same characteristics, interconnection and function as previously described in connection with FIG. 1. In an illustrative example, with one section of the dual 12AX7 for vacuum tube 1, the negative bias, C−, may be of the order of 1¼ volts; the grid return resistor, 4, may be one megohm; plate load resistor, 8, may be 50,000 ohms; isolation resistor, 9, may be 75,000 ohms; and the voltage of the positive supply, 10, may be 250 volts. Instead of the C bias the known cathode bias resistor may be used and may have a value of 1,250 ohms.

In FIG. 2 amplifier 11 becomes cathode-follower-connected vacuum tube 15. This may be the second triode section of a 12AX7 vacuum tube or it even may be a pentode. In any event, the grid thereof 16 connects directly to previous plate 7. Plate 17 connects directly to positive voltage supply 10. Cathode 18 connects to cathode resistor 19, which resistor has a resistance not more than 60,000 ohms. The opposite connection to resistor 19 connects to ground. Cathode 18 also connects to the anode of zener diode 20, the cathode of which connects to the junction between resistors 8 and 9. The zener diode takes the place of battery 12 in FIG. 1, in that it provides a fixed voltage drop through which the alternating signal can flow. The output terminal of the single stage of amplification is 21 and this also connects to cathode 18.

The maximum output voltage swing is limited to a value less than the voltage drop across resistor 9 and increases in proportion to the ratio of the current through zener diode 20 to the current through vacuum tube 1. The current through tube 15 should be at least equal to the current through the zener diode, which, in turn, should be at least equal to the current through vacuum tube 1. This situation limits the output voltage swing to approximately 50% of the quiescene voltage drop across resistor 9.

In FIG. 3 the same type of amplifier stage is illustrated with an NPN transistor 23 taking the place of prior amplifier 11. Elements 1 through 10 are as has been previously described. The voltage at terminal 10 is preferably less than before because of the limitation imposed by the breakdown voltage of transistors. It is thus desirable to use a tube that will operate at lower voltages, such as a 6DJ8.

Transistor 23 is connected as an emitter-follower, with base 24 connected directly to plate 7, collector 25 directly to positive voltage source 10, and emitter 26 connected to emitter resistor 27, which is in turn connected to ground. Emitter 26 is also connected to the anode of zener diode 28 and to output terminal 29. The cathode of the zener diode connects to the junction between resistors 8 and 9. Emitter resistor has a resistance such that current requirements are met; that is, resistor 27 has a value not to exceed 25,000 ohms for the example being considered. The voltage drop required of the zener diode is in the range of 5 to 15 volts. Transistor stage 23 has a gain close to unity and the circuit functions as has been previously described.

FIG. 4 follows the circuit of FIG. 3 in elements 1 through 10. PNP transistor 31 takes the place of prior NPN transistor 23. The base 32 of the PNP transistor connects directly to plate 7; its collector 33 connects directly to ground; and collector 34 connects to the anode of zener diode 35, the cathode of which connects directly to the junction between resistors 8 and 9. The voltage drop for this zener diode is also preferably in the 5 to 15 volt range. Capacitor 36, of 5 mfd. capacitance, connects directly across the zener diode 35 and insures that the signal which flows in this circuit shall have a low impedance path. This capacitor also prevents addition of noise to the circuit, as may be caused by the operation of certain zener diodes. An equivalent capacitor may be employed across the zener diode in FIGS. 2 or 3 for the same reason. In FIG. 4, output terminal 37 connects to emitter 34 of the transistor. It will also be understood that the battery 12 of FIG. 1 may be employed in FIGS. 2 through 4 instead of the zener diode and that a capacitor 36 may additionally be shunted across the battery.

In each of the circuits of FIGS. 1 through 4 the effective plate load impedance (resistance), $R_L'$, is:

$$R_L'=\frac{R_L}{1-A}=\frac{R_L}{1-1\text{ (approx.)}}=\text{infinity (approx.)} \qquad (3)$$

Each of the circuits of FIGS. 1 through 4 are direct current amplifier circuits. When this capability is not required or desired the circuit of FIG. 5 may be employed. A capacitor 40, typically of 50 mfd. capacitance, takes the place of the prior battery 12 or the zener diodes. It will be understood that the circuits of FIGS. 1 through 4 could also use the capacitor 40 and that a zener diode or a battery could be used in FIG. 5. The amplification of the circuit of FIG. 5 is effective to zero frequency, but not at full amplitude nor at the prior long term stability below a frequency of ten cycles per second, as an example.

The amplitude may reduce to 75% of that at frequencies above ten cycles at zero frequency and the stability will be in part dependent upon such parameters as make up mutual conductance and not upon the amplification factor $\mu$ alone.

Additionally, the circuit of FIG. 5 provides for accepting a differential input signal; this being $e_1$ at input terminal 41 and $e_2$ at input terminal 42. These input terminals are returned to ground via resistors 43 and 44, respectively, each having a resistance of the order of 1 megohm. Each input terminal is connected to the grid of an input vacuum tube; as grid 45 of tube 47 and grid 46 of tube 48, respectively. These tubes may be the two sections of a type 12AX7 vacuum tube. Both cathodes, 49 and 50, are connected together and to a common cathode resistor 51, which has a resistance of 50,000 ohms for a typical example in which the total cathode current is 2 milliamperes. This resistor is in turn connected to the negative terminal of C-battery 52, the positive terminal of which is connected to ground. Typically, this battery has a voltage of 100 volts.

Plate 53 of triode 47 is connected directly to a tap on plate supply battery 54. The whole voltage of this battery is of the order of 400 volts, with the tap being at 150 volts. Both batteries 52 and 54 may be replaced by regulated power supplies, as is known to the art. Triode 47 is connected to be a cathode-follower vacuum tube.

The other triode, 48, becomes the one having the effective infinite plate load impedance, as will be generally recognized from the circuit thereof in relation to the circuits previously described. The plate 56 thereof connects to resistors 57 and 58 in series, which, in turn, are connected to the positive terminal of battery 54. Tetrode 59 (which may also be a pentode) serves in the place of triode 15 of FIG. 2; the possibility of which was previously mentioned. Grid 60 connects directly to plate 56 of triode 48 of FIG. 5. Plate 61 of tetrode 59 connects directly to the positive terminal of battery 54. Screen grid 62 also connects to the positive terminal of battery 54, but through resistor 63. The value of this resistance must be low enough to supply both the screen current and the current to operate zener diode 64, the latter operating to provide a fixed voltage for the screen grid with respect to the potential of cathode 65. The anode of the zener diode is connected to cathode 65. The zener diode may have a constant voltage drop rating within the range of from 30 to 100 volts, depending upon the screen voltage required for the particular type of tube employed for tube 59.

Cathode 65 is also connected to ground through cathode resistor 66, typically having a resistance of 20,000 ohms, and further, to output terminal 67 and to capacitor 40, the latter having been previously identified. The embodiment of FIG. 5 thus provides an amplifier having a differential input and a single-ended output.

FIG. 6 shows a complete amplifier, having, for example, a power output capability of 250 watts and a gain of the order of 100 times. A double-ended input is provided with a double-ended output from the driver stages, while a push-pull output is had from the power amplifier. The circuit is symetrical insofar as the amplifier proper is concerned, thus, only the top half of FIG. 6 will be described in detail.

An input signal $e_1$ (differentially related to an opposite signal $e_2$) is impressed at input terminal 70. This connects directly to grid 71 of vacuum tube 72, which vacuum tube may be one section of a 12AX7 type. The grid is returned to ground through resistor 73, of one megohm resistance. Plate 74 is connected directly to a source of plate supply voltage, the positive terminal of which is represented by terminal 75. The voltage here may be 125 volts.

Cathode 76 is connected directly to base 77 of NPN transistor 78 and also to one terminal of resistor 79, which resistor may have a resistance of 3,000 ohms. Emitter 80 of transistor 78 connects to the second terminal of resistor 79. Collector 81 thereof connects directly to positive terminal 82, which may supply a voltage of six volts. Emitter 80 also connects to resistor 83, of 7,000 ohms resistance, and therethrough to negative voltage source —C, which typically supplies a minus 39 volts potential.

It is seen that transistor 78 forms a cathode impedance for cathode-follower-connected triode 72 and provides a reduction in driving impedance to the following stages of over 100 times; i.e., from 1,000 ohms to less than 10 ohms. Transistor 78 also enhances the already good linearity of operation of tube 72 by providing a high effective cathode impedance for the tube. The value of this impedance has a principal component which is equal to the resistance of resistor 79 divided by one minus the voltage gain of transistor 78. This voltage gain closely approaches unity. This impedance value is shunted by the input impedance of the transistor, which input impedance is approximately equal to the resistance of resistor 83 times the beta value of the transistor.

Emitter 80 also connects to summing impedance 84, which is here shown as a resistor having a resistance of the order of 1,000 ohms. The second terminal of impedance 84 connects to a cathode resistor 85 and also directly to grid 86 of opposed triode 87. An equivalent circuit connects summing impedance 88 directly to grid 89 of triode 90 and to cathode resistor 91 for triode 86. Cathode resistors 85 and 91 have a nominal value of 1,000 ohms each. These are each shunted by a cathode bypass capacitor, as 92, having a capacitance of 0.01 mfd. An additional resistor 93 connects the junction of cathode 95 and resistor 85 to ground. It has a resistance of 50,000 ohms.

Vacuum tubes 90 and 94 may be the triode-tetrode combination in one vacuum envelope known as the ECL86 (European) or 6GW8 (United States). In such tubes the connection from the plate of the triode to the control grid of the tetrode is essentially internal and a driven shield is provided, all having the effect of lowering the distributed capacitance of the tubes. This increases the bandwidth of operation to a substantial degree. If extension of the upper frequency of operation is not important, then separate vacuum tubes may be used, and, if desired, a pentode for tube 94.

In FIG. 6, cathode 95 of triode 90 connects to cathode resistor 85. Plate 96 thereof connects directly to grid 97 of tetrode 94. Plate 96 also connects to plate load impedance resistor 98 and therethrough to isolating resistor 99 and to positive voltage source terminal 100. This may supply a voltage of the order of 450 volts. Plate 101 of the tetrode connects directly to terminal 100, while the screen grid 102 connects to resistor 103, of 60,000 ohms resistance, and therethrough to terminal 100.

As explained in connection with FIG. 5, capacitor 104, of 60 mfd. capacitance, conveys the signal being amplified back to the junction of resistors 98 and 99. Zener diode 105 stabilizes the potential of screen grid 102 and may have a voltage drop rating of 82 volts. A capacitor 113, of 5 mfd. capacitance, is shunted across the zener diode to insure conveyance of the signal and to eliminate diode-originated electrical noise. Cathode resistor 106 is connected to cathode 107 of tetrode 94 and may have a resistance of 20,000 ohms.

The signal that has been amplified in the recited driver stages according to my invention is conveyed to grid 108 of power tube 109 via capacitor 110, of 2 mfd. capacitance and via suppressor resistor 111, which may have a resistance of 100 ohms. Grid 108 is returned to a grid bias supply —C, of 30 volts negative with respect to ground via resistor 112. This resistor is typically of 100,000 ohms resistance. Cathode 114 connects to ground. Plate 115 connects to one extremity of primary 116 of output transformer 117. The center tap of primary 116 connects to the positive terminal 118 of a power supply source of typically 450 volts. A useful load, such as a loudspeaker, is attached to secondary 119 of the step-down output transformer.

It will be recalled that my pre-amplifiers perform excellently without feedback. However, when a power amplifier is added, a tertiary winding 120 is provided upon output transformer 117, wound with equal coupling to both sides of primary 116. The negative feedback circuit of which it is a part may be asymmetrical, one terminal of winding 120 is thus grounded. The opposite terminal connects to resistor 121, which has a resistance in the sub-megohm range, and which connects to input terminal 70. This provides over-all negative feedback. Such feedback may also be taken from secondary 119, as an alternate embodiment.

The circuit of FIG. 6 allows internal symmetrical positive feedback when the negative feedback is employed. With the symmetrical arrangement half the feedback required is provided on each side of the amplifier. Power supply variations thus become common mode variations and are less effective in introducing ripple into the signal. Such positive feedback is provided by capacitor 123, of 0.22 mfd. capacitance, connected to cathode 107 and to resistor 124, of 200,000 ohms resistance, in a series relation connected back to summing impedance 84, on the side that connects to grid 86 of tube 87. Resistor 124 may be made variable to realize the optimum degree of positive feedback.

Since there is no change of phase from terminal 70 to the above-defined terminal of summing impedance 84, the over-all feedback resistor 121 can be connected to that defined terminal as an alternate embodiment.

For the alternate embodiment in which secondary 119 takes the place of tertiary 120 the connections to secondary 119 are as to tertiary 120, but the secondary retains its step-down ratio as before.

It is aditionally possible to provide further negative feedback, and of a balanced nature, by connecting capacitor 122, which may have a small capacitance of the order of from one to three mmfd., from plate 115 to grid 86 of triode 87. A symmetrical connection is made from the lower side of the amplifier to grid 89 of triode 90. This feedback is effective at the high frequencies of the signal-handling range of the amplifier.

In order that equal gain be provided for signals applied to both cathode 95 of triode 90 and grid 86 of triode 87, a voltage divider comprised of resistors 85 and 93 is formed to give additional loss in the cathode circuit. The gain of triode 90 (and triode 87 as well) is $\mu$ for a signal impressed upon the grid and it is $\mu+1$ for a signal impressed upon the cathode. The loss is adjusted to make the gain equal to $\mu$ in each case.

It will be noted that input signal $e_1$ is provided as an amplified output from the driver stages at capacitor 110 as a non-phase-inverted signal, while input signal $e_2$ is inverted at that capacitor. The opposite state of affairs holds at corresponding output capacitor 125.

Although specific examples of voltages and values for circuit elements have been given in this specification to illustrate the invention, it is to be understood that these are by way of example only and that consonant departures can be taken therefrom without departing from the inventive concept. Other modifications of the circuit elements, details of circuit connections and alteration of the coactive relation between elements may also be taken under my invention.

Having thus fully described my invention and the manner in which it is to be practiced, I claim:

1. An amplifier effective to zero frequency comprising;

(a) a vacuum tube having only a grid, a cathode and a plate, (b) a load impedance connected to said plate, (c) an other impedance connected to said load impedance and also in series to a positive voltage source, (d) a non-phase-inverting essentially unity-gain amplifier connected to said plate and to an output terminal, (e) constant voltage signal-passing means having an impedance low with respect to that of said load impedance connected from said output terminal to the junction between said load impedance and said other impedance, (f) the elements of (d) and (e) operative to provide an approximately infinite value of plate load impedance to said vacuum tube for approximately distortionless amplification by said vacuum tube with a gain determined essentially by the amplification factor of the structure of said vacuum tube.

2. The amplifier of claim 1 in which said unity-gain amplifier comprises a cathode-follower vacuum tube.

3. The amplifier of claim 1 in which said unity-gain amplifier comprises an NPN emitter-follower transistor.

4. The amplifier of claim 1 in which said unity-gain amplifier comprises a PNP transistor having an emitter connected to said output terminal.

5. The amplifier of claim 1 in which said signal-passing means comprises a battery.

6. The amplifier of claim 1 in which said signal-passing means comprises a zener diode.

7. The amplifier of claim 6 in which said zener diode is shunted by a capacitor.

8. The amplifier of claim 1 in which said unity-gain amplifier is a cathode-follower vacuum tube having at least two grids.

9. An amplifier effective to direct current in which the amplification of the signal is determined by the amplification factor of a vacuum tube comprising;

(a) a first cathode-follower vaccum tube having a cathode and a first source of signal connected to said vacuum tube, (b) a second vaccum tube having only a grid, a cathode and a plate and having the said amplification factor, (c) the cathode of said first cathode-follower vacuum tube connected to the cathode of said second vacuum tube and the cathodes of both said first and second vacuum tubes connected to a common impedance and therethrough to a signal ground, (d) a second source of signal connected to the grid of said second vacuum tube and having a signal differentially related to the signal of said first source of signal, (e) a plate load impedance connected to the plate of said second vacuum tube, (f) a third cathode-follower vacuum tube having at least grid, cathode and plate electrodes, (g) said grid electrode connected to the plate of said second vacuum tube, (h) an isolating impedance connecting said plate load impedance to a source of energizing potential for the plate of said second vacuum tube, (i) signal-passing means connecting said cathode electrode of said third cathode-follower vacuum tube to the junction between said plate load impedance and said isolating impedance, (j) the plate electrode of said third cathode-follower vacuum tube connected to said source of energizing potential, and (k) an impedance connecting said cathode electrode of said third cathode-follower vacuum tube to a signal ground, across which impedance the output signal of said amplifier appears.

10. The amplifier of claim 9 in which said signal-passing means is a capacitor.

11. The amplifier of claim 9 in which said signal-passing means is a zener diode.

12. The amplifier of claim 9 in which said signal-passing means is a battery.

13. An amplifier comprising;

(a) first and second cathode-follower input vacuum tubes,
(b) first and second emitter-follower transistors,
(c) first means to connect said first transistor as a cathode impedance for said first vacuum tube and second means to connect said second transistor as a cathode impedance for said second vacuum tube,
(d) third and fourth vacuum tubes, each having a grid, a cathode, a plate and a plate load impedance,
(e) third means including a first impedance to connect said first emitter-follower transistor to the cathode of said third vacuum tube and also to the grid of said fourth vacuum tube,
(f) fourth means including a second impedance to connect said second emitter-follower transistor to the cathode of said fourth vacuum tube and also to the grid of said third vacuum tube,
(g) fifth and sixth vacuum tubes each cathode-follower connected,
(h) fifth means to connect said fifth vacuum tube to said plate load impedance of said third vacuum tube to increase the effective value of said plate load impedance,
(i) sixth means to connect said sixth vacuum tube to said plate load impedance of said fourth vacuum tube to increase the effective value of said plate load impedance, and
(j) a connection to each of the cathodes of said fifth and sixth vacuum tubes to provide oppositely phased outputs from said amplifier.

14. The amplifier of claim 13 comprising additionally;
(a) a power amplifier connected to said fifth and sixth vacuum tubes and having an output transformer with a tertiary winding, and
(b) an impedance connected from said tertiary winding to the input of a said input vacuum tube for providing negative feedback for said amplifier.

15. The amplifier of claim 14 comprising additionally;
(a) a fifth impedance connected from the cathode of said fifth vacuum tube to the grid of said fourth vacuum tube, and
(b) a sixth impedance connected from the cathode of said sixth vacuum tube to the grid of said third vacuum tube,
(c) the elements and connections of (a) and (b) of this claim providing symmetrical internal positive feedback for said amplifier.

16. The amplifier of claim 13 comprising additionally;
(a) a power amplifier connected to said amplifier and having an output transformer with a primary and only a grounded secondary winding, and
(b) an impedance connected from said secondary winding to the grid of said fourth vacuum tube to provide negative feedback for said amplifier.

17. A driver amplifier circuit comprising;
(a) first and second input vacuum tubes each having a grid and a cathode,
(b) first and second transistors each having a base and an emitter,
(c) first means to connect the cathode of said first input vacuum tube to the base of said first transistor and through a first impedance to the emitter of said first transistor to form of said first transistor a cathode impedance for said first input vacuum tube,
(d) second means to connect the cathode of said second input vacuum tube to the base of said second transistor and through a second impedance to the emitter of said second transistor to form of said second transistor a cathode impedance for said second input vacuum tube,
(e) third and fourth vacuum tubes, each having a grid, a cathode, a plate, and also a plate load impedance connected to said plate,
(f) a third impedance connecting the emitter of said first transistor to the cathode of said third vacuum tube and also to the grid of said fourth vacuum tube,
(g) a fourth impedance connecting the emitter of said second transistor to the cathode of said fourth vacuum tube and also to the grid of said third vacuum tube,
(h) fifth and sixth vacuum tubes, each having a grid, a cathode and a screen grid,
(i) means to connect the grid of said fifth vacuum tube to the plate of said third vacuum tube and equivalent means to connect the grid of said sixth vacuum tube to the plate of said fourth vacuum tube,
(j) a fifth impedance connected between the screen grid of said fifth vacuum tube and that end of said plate load impedance opposite to the plate connection thereto of said third vacuum tube to increase the effective value of said plate load impedance,
(k) a sixth impedance connected between the screen grid of said sixth vacuum tube and that end of said plate load impedance opposite to the plate connection thereto of said fourth vacuum tube to increase the effective value of said plate load impedance,
(l) first constant-voltage means connected between the screen grid and the cathode of said fifth vacuum tube,
(m) second constant-voltage means connected between the screen grid and the cathode of said sixth vacuum tube,
(n) a seventh impedance connected to the cathode of said fifth vacuum tube to provide a voltage output therefrom, and
(o) an eighth impedance connected to the cathode of said sixth vacuum tube to provide a voltage output therefrom.

References Cited

UNITED STATES PATENTS

| | | | |
|---|---|---|---|
| 2,705,265 | 3/1955 | Hall | 330—69 |
| 2,879,410 | 3/1959 | Loeb. | |
| 2,896,171 | 7/1959 | Erath. | |
| 3,173,098 | 3/1965 | Peretz | 330—69 X |
| 3,199,041 | 8/1965 | Peretz | 330—20 X |

ROY LAKE, *Primary Examiner.*

NATHAN KAUFMAN, *Examiner.*